United States Patent
Teng

(10) Patent No.: US 6,777,896 B2
(45) Date of Patent: Aug. 17, 2004

(54) METHODS AND APPARATUS FOR INITIALIZING A PLANAR MOTOR

(75) Inventor: Ting-Chieng Teng, Fremont, CA (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/193,080

(22) Filed: Jul. 9, 2002

(65) Prior Publication Data

US 2004/0007920 A1 Jan. 15, 2004

(51) Int. Cl.$^7$ ............................................ H01L 21/00
(52) U.S. Cl. .......................... 318/135; 355/72; 355/53
(58) Field of Search ............................. 310/12, 13, 14; 355/53, 72

(56) References Cited

U.S. PATENT DOCUMENTS

| | | | | | |
|---|---|---|---|---|---|
| 5,319,336 | A | * | 6/1994 | Alcon | 335/296 |
| 5,548,195 | A | * | 8/1996 | Doran | 318/568.19 |
| 5,777,721 | A | | 7/1998 | Makinouchi | 355/53 |
| 5,925,956 | A | * | 7/1999 | Ohzeki | 310/90.5 |
| 6,003,230 | A | * | 12/1999 | Trumper et al. | 33/1 M |
| 6,144,118 | A | * | 11/2000 | Cahill et al. | 310/12 |

FOREIGN PATENT DOCUMENTS

| | | |
|---|---|---|
| JP | 54-145911 | 11/1979 |
| JP | 1-198813 | 8/1989 |
| JP | 10-206104 | 8/1998 |
| JP | WO00/46911 | 8/2000 |

OTHER PUBLICATIONS

Keiichi Tanaka, Flat Motor Device and Its Driving Method, Stage Device, and Its Driving Method, Exposure Apparatus and Exposure Method, and Device and Its Manufacturing Method, U.S. patent application filed Aug. 6, 2001, U.S. application Ser. No. 09/890,934, 95 pages of Specification, and 18 drawings.

Toshio Ueta et al., "Moving Magnet Type Planar Motor Control", U.S. application No. 10/000,370, filed Dec. 4, 2001, 30 pages, 16 pages.

* cited by examiner

*Primary Examiner*—Thanh Lam
*Assistant Examiner*—Judson H. Jones
(74) *Attorney, Agent, or Firm*—Beyer Weaver & Thomas, LLP

(57) ABSTRACT

Methods and apparatus are provided for initializing a planar motor. A magnet array floating above a coil array may reside in one of a definite number of positions upon the introduction of current into the coil array. Torque characteristics of the magnet array are acquired when driving the magnet array with no phase offsets. Phase offsets for driving the magnet array with substantially no yaw can then be determined by analyzing the torque characteristics.

23 Claims, 18 Drawing Sheets

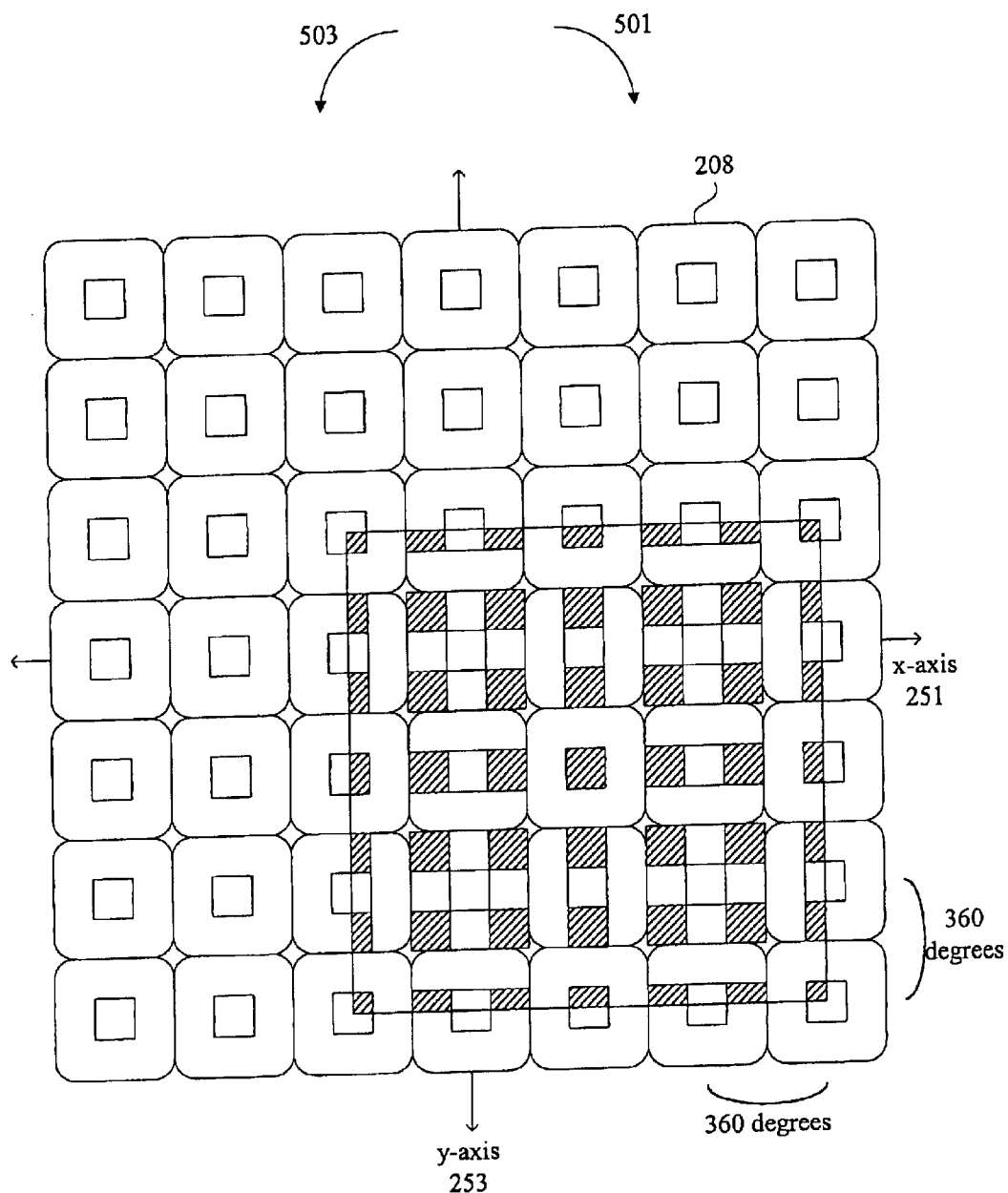

US 6,777,896 B2

METHODS AND APPARATUS FOR INITIALIZING A PLANAR MOTOR

CROSS-REFERENCE TO RELATED APPLICATIONS

The present application is related to U.S. patent application Ser. No. 10/000,370 to Bausan Yuan filed on Dec. 4, 2001 and titled Moving Magnet Type Planar Motor Control, the entirety of which is incorporated by reference for all purposes.

BACKGROUND OF THE INVENTION

1. Field of the Invention

The present application relates to implementing a planar motor. More specifically, the present application relates to methods and apparatus for initializing a planar motor with phase offsets for driving a magnet array with substantially no yaw.

2. Description of Related Art

Typical techniques for initializing a planar motor require the use of robotics and/or highly sensitive measuring equipment to initially position a magnet array above a coil array. However, such techniques can be extremely costly and subject to inefficiencies.

It is therefore desirable to provide methods and apparatus for improving the initialization of a planar motor with respect to some or all of the performance limitations noted above.

SUMMARY OF THE INVENTION

Methods and apparatus are provided for initializing a planar motor. A magnet array floating above a coil array may reside in one of a definite number of positions upon the introduction of current into the coil array. Torque characteristics of the magnet array are acquired when driving the magnet array with no phase offsets. Phase offsets for driving the magnet array with substantially no yaw can then be determined by analyzing the torque characteristics.

In one embodiment, a method for initializing a planar motor is provided. A current is provided to a coil array to drive a planar magnet array in a first direction. First torque characteristics associated with driving the planar magnet array in the first direction are determined. A first current offset is provided using the first torque characteristics for driving the planar magnet array in the first direction with substantially no yaw.

In another embodiment, a method for initializing a stage device including a planar motor that positions the stage using a position detector is provided. A current is provided to a coil array to drive a planar magnet array in a first direction. First torque characteristics associated with driving the planar magnet array in the first direction are determined. A first current offset is provided using the first torque characteristics for driving the planar magnet array in the first direction with substantially no yaw.

In another embodiment, a method for initializing a photolithography system including an illumination system that irradiates radian energy and a planar motor that positions a movable stage relative to the path of said radiant energy using a position detector is provided. A current is provided to a coil array to drive a planar magnet array in a first direction. First torque characteristics associated with driving the planar magnet array in the first direction are determined. A first current offset is provided using the first torque characteristics for driving the planar magnet array in the first direction with substantially no yaw.

In still another embodiment, a photolithography system is provided. The photolithography system includes a drive system and a detector system. The drive system is operable to provide current to a coil array to drive a planar magnet array in a first direction. The detector system is operable to determine first torque characteristics associated with driving the planar magnet array in the first direction. The drive system is further operable to provide a first current offset using the first torque characteristics for driving the planar magnet array in the first direction with substantially no yaw.

These and other features and advantages of the present invention will be presented in more detail in the following specification of the invention and the accompanying figures, which illustrate by way of example the principles of the invention.

BRIEF DESCRIPTION OF THE DRAWINGS

The invention may best be understood by reference to the following description taken in conjunction with the accompanying drawings, which are illustrative of specific embodiments of the present invention.

FIGS. 5A–5I are diagrammatic representations showing initial positions of a magnet array with respect to a coil array.

DETAILED DESCRIPTION OF SPECIFIC EMBODIMENTS

The present application relates to implementing an authentication accelerator. More specifically, the present application relates to methods and apparatus for providing an authentication accelerator capable of performing a variety of different authentication operations on input data.

Reference will now be made in detail to some specific embodiments of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims.

Figure 1:
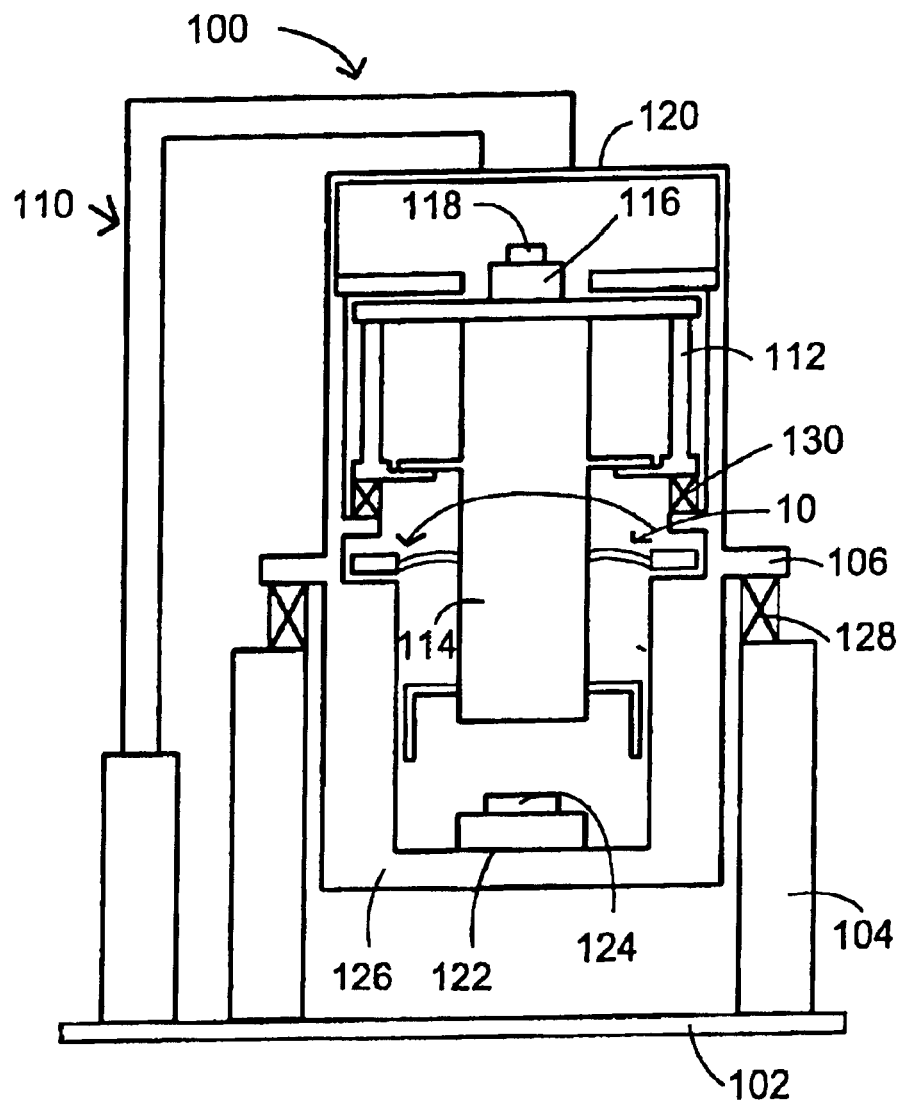
FIG. 1 is a diagrammatic representation of a system that can use the techniques of the present invention.

Referring next to FIG. 1, one exemplary lithographic exposure that incorporates the present invention will be briefly described. A typical exposure apparatus 100 includes a mounting base 102, a support frame 104, a base frame 106, a measurement system (not shown), a control system (not shown), an illumination system 110, an optical frame 112, an optical device 114, a reticle stage 116 for retaining a reticle 118, an upper enclosure 120 surrounding reticle stage 116, a wafer stage 122 for retaining a semiconductor wafer workpiece 124, and a lower enclosure 126 surrounding wafer stage 122.

Support frame 104 typically supports base frame 106 above mounting base 102 through a base vibration isolation system 128. Base frame 106 in turn supports an optical vibration isolation system 130, upper enclosure 120, wafer stage 122, and lower enclosure 126. Optical isolation system 130 supports optical frame 112 that support optical device 114, and reticle stage 116 above base frame 106. As a result thereof, optical frame 112 and its supported components and base frame 106 are effectively attached in series through base vibration isolation system 128 and optical vibration isolation system 130 to mounting base 102. Vibration isolation systems 128 and 130 are designed to damp and isolate vibrations between components of exposure apparatus 100.

Measurement system monitors the positions of stages 116 and 122 relative to a reference such as optical device 114 and outputs position data to the control system. Optical device 114 typically includes a lens assembly that projects and/or focuses the light or beam from an illumination system 110 that passes through reticle 118. Reticle stage 116 is attached to one or more movers (not shown) directed by the control system to precisely position reticle 118 relative to optical device 114. Similarly, wafer stage 122 includes one or more movers (not shown) to precisely position the wafer workpiece 124 relative to optical device (lens assembly) 114. Any of the previously describe seals 10 is placed between base frame 106 (the upper enclosure 120) and the lens assembly 114.

As will be appreciated by those skilled in the art, there are a number of different types of photolithographic devices. For example, exposure apparatus 100 can be used as a scanning type photolithography system which exposes the pattern from reticle 118 onto wafer 124 with reticle 118 and wafer 124 moving synchronously. In a scanning type lithographic device, reticle 118 is moved perpendicular to an optical axis of lens assembly 114 by reticle stage 116 and wafer 124 is moved perpendicular to an optical axis of lens assembly 114 by wafer stage 122. Scanning of reticle 118 and wafer 124 occurs while reticle 118 and wafer 124 are moving synchronously.

Alternately, exposure apparatus 100 can be a step-and-repeat type photolithography system that exposes reticle 118 while reticle 118 and wafer 124 are stationary. In the step and repeat process, wafer 124 is in a constant position relative to reticle 118 and lens assembly 114 during the exposure of an individual field. Subsequently, between consecutive exposure steps, wafer 124 is consecutively moved by wafer stage 122 perpendicular to the optical axis of lens assembly 114 so that the next field of semiconductor wafer 124 is brought into position relative to lens assembly 114 and reticle 118 for exposure, Following this process, the images on reticle 118 are sequentially exposed onto the fields of wafer 124 so that the next field of semiconductor wafer 124 is brought into position relative to lens assembly 114 and reticle 118.

However, the use of exposure apparatus 100 provided herein is not limited to a photolithography system for a semiconductor manufacturing. Exposure apparatus 100, for example, can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern by closely locating a mask and a substrate without the use of a lens assembly. Additionally, the present invention provided herein can be used in other devices, including other semiconductor processing equipment, machine tools, metal cutting machines, and inspection machines.

The illumination source (of illumination system 110) can be g-line (436 nm), i-line (365 nm), KrF excimer laser (248 nm), ArF excimer laser (193 nm) and F2 laser (157 nm). Alternatively, the illumination source can also use charged particle beams such as x-ray and electron beam. For instance, in the case where an electron beam is used, thermionic emission type lanthanum hexaboride (LaB6,) or tantalum (Ta) can be used as an electron gun. Furthermore, in the case where an electron beam is used, the structure could be such that either a mask is used or a pattern can be directly formed on a substrate without the use of a mask.

With respect to lens assembly 114, when far ultra-violet rays such as the excimer laser is used, glass materials such as quartz and fluorite that transmit far ultra-violet rays is preferably used. When the F2 type laser or x-ray is used, lens assembly 114 should preferably be either catadioptric or refractive (a reticle should also preferably be a reflective type), and when an electron beam is used, electron optics should preferably comprise electron lenses and deflectors. The optical path for the electron beams should be in a vacuum.

Also, with an exposure device that employs vacuum ultra-violet radiation (VUV) of wavelength 200 nm or lower, use of the catadioptric type optical system can be considered. Examples of the catadioptric type of optical system include the disclosure Japan Patent Application Disclosure No. 8-171054 published in the Official Gazette for Laid-Open Patent Applications and its counterpart U.S. Pat. No. 5,668,672, as well as Japan Patent Application Disclosure No. 10-20195 and its counterpart U.S. Pat. No. 5,835,275. In these cases, the reflecting optical device can be a catadioptric optical system incorporating a beam splitter and concave mirror. Japan Patent Application Disclosure No. 8-334695 published in the Official Gazette for Laid-Open Patent Applications and its counterpart U.S. Pat. No. 5,689,377 as well as Japan Patent Application Disclosure No. 10-3039 and its counterpart U.S. Pat. No. 5,892,117 also use a reflecting-refracting type of optical system incorporating a concave mirror, etc., but without a beam splitter, and can also be employed with this invention. The disclosures in the above mentioned U.S. patents are incorporated herein by reference.

Further, in photolithography systems, when linear motors (see U.S. Pat. Nos. 5,623,853 or 5,528,118) are used in a wafer stage or a reticle stage, the linear motors can be either an air levitation type employing air bearings or a magnetic levitation type using Lorentz force or reactance force. Additionally, the stage could move along a guide, or it could be a guideless type stage which uses no guide. The disclosures in U.S. Pat. Nos. 5,623,853 and 5,528,118 are incorporated herein by reference.

Alternatively, one of the stages could be driven by a planar motor, which drives the stage by electromagnetic force generated by a magnet unit having two-dimensionally arranged magnets and an armature coil unit having two-dimensionally arranged coils in facing positions. With this type of driving system, either one of the magnet unit or the armature coil unit is connected to the stage and the other unit is mounted on the moving plane side of the stage.

Movement of the stages as described above generates reaction forces which can affect performance of the photolithography system. Reaction forces generated by the wafer (substrate) stage motion can be mechanically released to the floor (ground) by use of a frame member as described in U.S. Pat. No. 5,528,118 and published Japanese Patent Application Disclosure No. 8-166475. Additionally, reaction forces generated by the reticle (mask) stage motion can be mechanically released to the floor (ground) by use of a frame member as described in U.S. Pat. No. 5,874,820 and, published Japanese Patent Application Disclosure No. 8-330224. The disclosures in U.S. Pat. Nos. 5,528,118 and 5,874,820 are incorporated herein by reference.

As described above, a photolithography system according to the above described embodiments can be built by assembling various subsystems, including each element listed in the appended claims, in such a manner that prescribed mechanical accuracy, electrical accuracy and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, total adjustment is performed to make sure that every accuracy is maintained in the complete photolithography system. Additionally, it is desirable to manufacture an exposure system in a clean room where the temperature and humidity are controlled.

Figure 2:
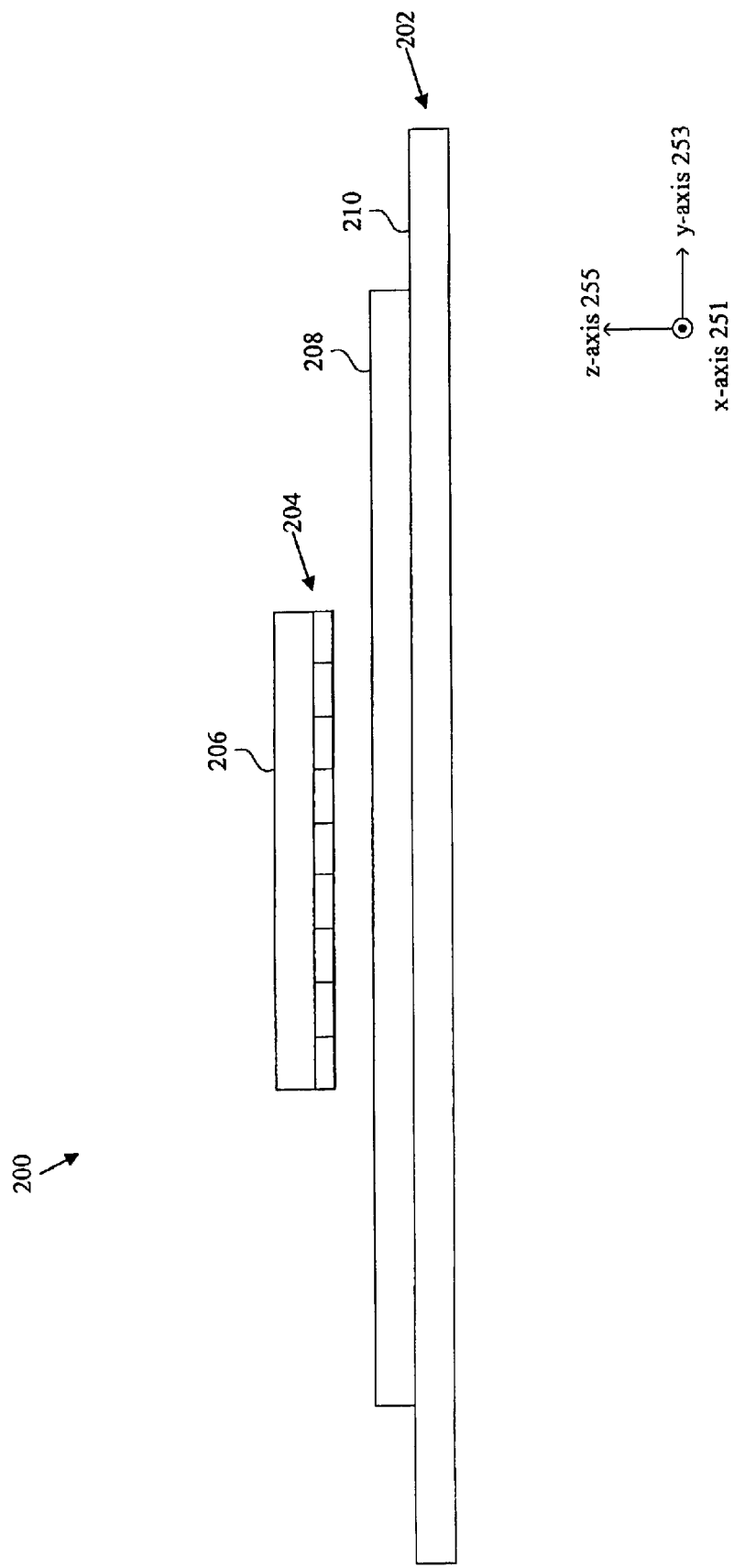
FIG. 2 is a diagrammatic representation of a moving magnet planar motor.

FIG. 2 is a diagrammatic representation of one embodiment of a planar motor 200 including a planar coil array 202 and a magnet array 204. Moving magnet planar motors suitable for the present invention are disclosed, for example, in U.S. patent application Ser. No. 10/000,370 to Bausan Yuan and titled Moving Magnet Type Planar Motor Control, U.S. Pat. No. 6,097,114 to Hazelton, U.S. Pat. No. 6,114,781 to Hazelton et al., and U.S. Pat. No. 6,188,147 B1 to Hazelton et al., the entireties of which are hereby incorporated by reference for all purposes. A magnet array 204 is attached to a moving portion of a positioning stage 206. In this embodiment, positioning stage 206 is a part of a wafer stage 122 to hold wafer 124 and position wafer 124 relative to optical device 114 or radiant energy from illumination system 110.

Coils 208 of coil array 202 are attached to a fixed platen 210. In this embodiment, magnet array 204 is sized such that four groups of coils 208 (16 coils) fit underneath magnet array 204. Coils 208 can be switched electrically such that only the coils that are underneath magnet array 204 for producing force are energized. The other coils are switched off to minimize heating of the system. According to various embodiments, magnet array 204 is configured to provide a magnetic flux field that interacts with coil array 202 to produce forces to move positioning stage 206 in three degrees of freedom (conventionally designated x, y, θz) above coil array 202. In one example, the stage can move along the x-axis 251, along the y-axis 253, and rotate in the plane defined by x-axis 251 and y-axis 253. Although not shown in FIG. 2, mechanisms such as air bearings and associated smooth, hard surfaces may be provided to facilitate movement of magnet array 204 with respect to coil array 202.

It should be noted that the techniques of the present invention can also be applied stages with varying degrees of freedom. In one example, it is contemplated that the techniques of the present invention can be applied to a stage that can move in the degrees of freedom specified by the z-axis 255, θx and θy.

Figure 3:
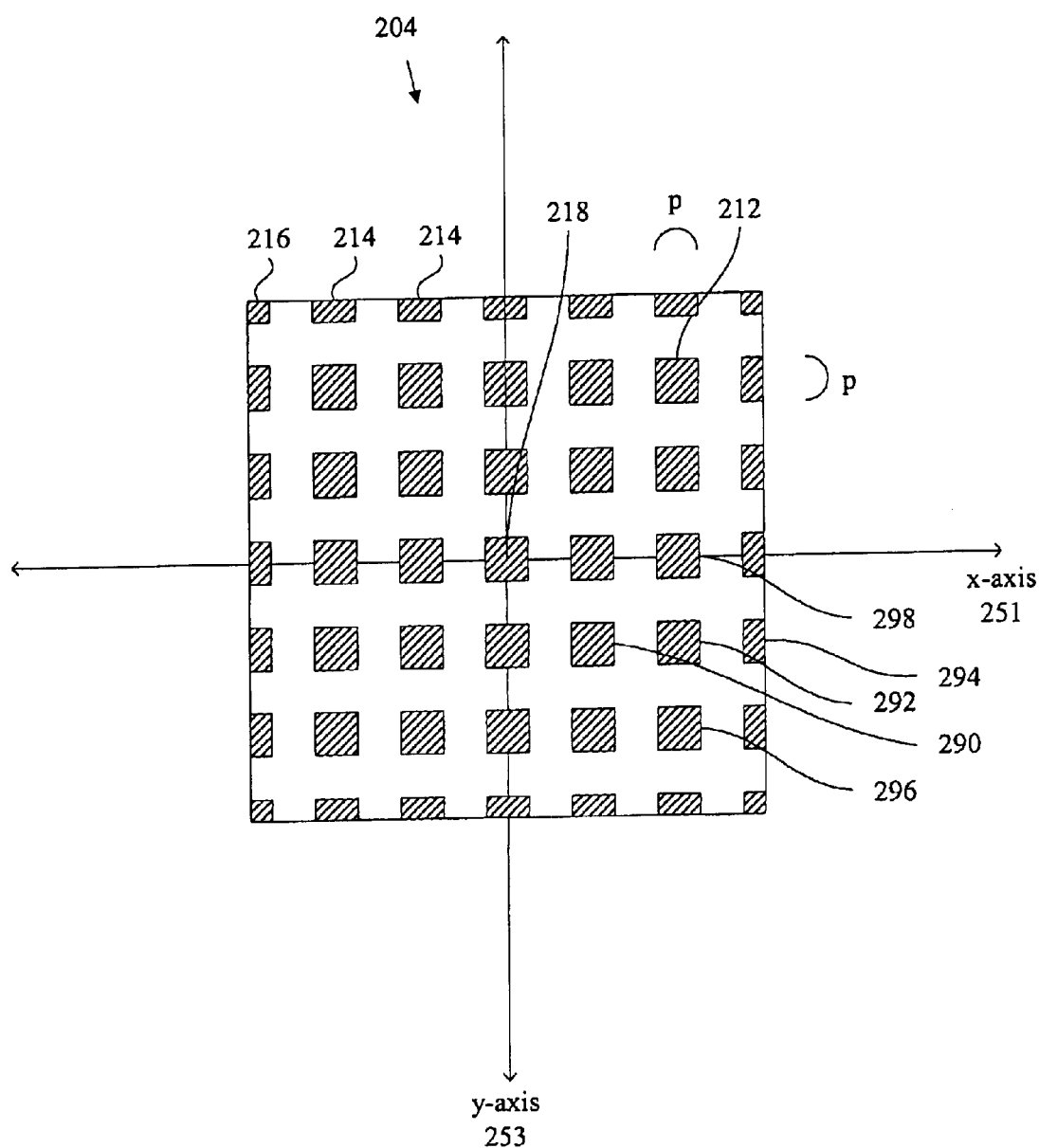
FIG. 3 is a diagrammatic representation of a magnet array.

FIG. 3 is a diagrammatic representation of one example of a planar magnet array. Any substantially planar surface having a plurality of magnetic elements is referred to herein as a planar magnet array. Any surface having a plurality of magnetic elements is referred to herein as a magnet array. One example of a planar magnet array is planar magnet array 204. Planar magnet array 204 includes a plurality of centrally located, full sized square magnets 212, a plurality of peripherally located half magnets 214, and a plurality of quarter magnets 216 at the four corners. Half magnets 214 generate substantially one half of the magnetic flux of full sized magnets 212, while quarter magnets 216 generate substantially one quarter of the flux. The half magnets 214 and quarter magnets 216 provide efficient magnetic flux coupling with full sized magnets 212. Magnet array 204 is disposed about a center of gravity or origin 218, and magnets 212, 214, 216 form rows in the x-direction and columns in the y-direction as defined by x-axis 251 and the y-axis 253.

Using these axes, one half of the distance along the x-axis 251 or the y-axis 253 between the centers of adjacent full sized magnets 212 is referred to herein as the magnetic pitch. According to various embodiments, each full sized magnet 212 has a length and width of about 1 pitch, p, and an area of about one pitch squared as shown in FIG. 3. In many implementations, the polarity of the magnets are arranged so that the polarity of the magnet's surface closest to the coil array is opposite that of the surfaces of its immediate neighbors along the x-axis 251 and the y-axis 253. For example, the polarity of magnet 292 is north, while the polarity of neighboring magnets 290, 294, 296, and 298 is south.

It should be recognized that a variety of different planar magnet arrays are contemplated. In one embodiment, a 5×5 square array of full sized magnets surrounded by peripheral and corner magnets is provided. In other embodiments, more or fewer magnets can be arranged to form patterns other than square arrays. In still other embodiments, the full sized magnets do not need to be square.

Figure 4:
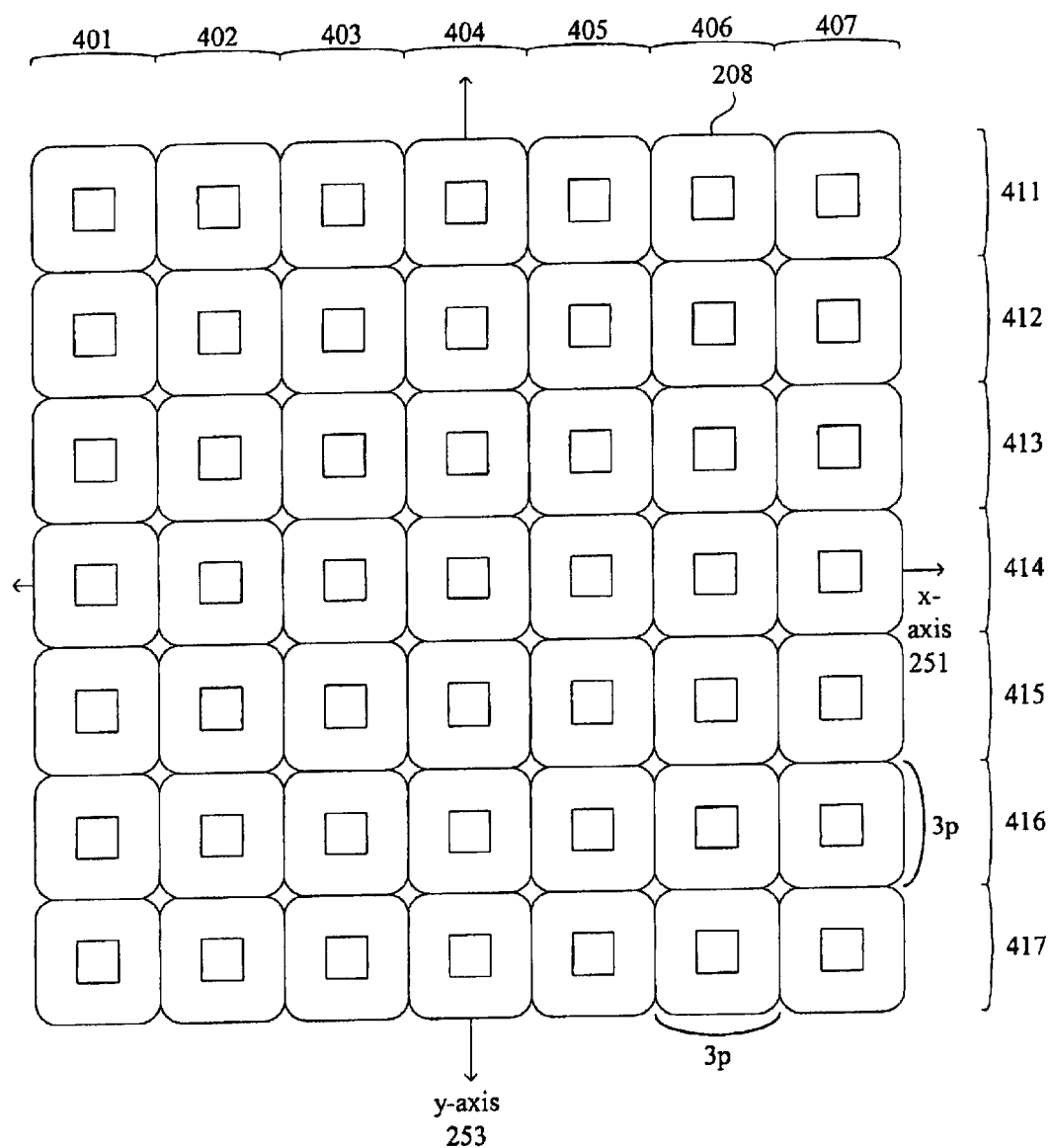
FIG. 4 is a diagrammatic representation of a coil array.

FIG. 4 is a diagrammatic representation of a coil array. A surface having a plurality of coils for generating electromagnetic fields for supporting a planar magnet array using Lorentz forces is referred to herein as a coil array. A planar magnet array 204 is typically 204 is disposed above coils 208 which are arranged in the current embodiment in a 7×7 square array. Seven coils are in each column 401–407 and seven coils are in each row 411–417, forming an array of 49 coils 208. According to various embodiments, the combination of magnet array 204 and an array of coils 208 permits planar motor control in 3 degrees of freedom.

In one example, each coil 208 has a length and width of about 3 pitch, 3 p, and an area of about 9 p squared. Persons of ordinary skill in the art will appreciate that the present invention may be readily adapted to control magnet arrays of different dimensions. According to various embodiments, a 5×5 or larger array of coils 208 is used, and the size of the coil array is selected in part based on the desired travel range for magnet array 204. In other embodiments, the numbers of rows and columns in a magnet array may be substantially larger and/or the number of rows and the number of columns may be unequal.

To drive the leading the array is above a coil array along the x-axis 251 and the y axis 253, currents with specific amplitudes and phase values are introduced into each of the different coils. To determine the amplitude and phase values, the magnet force constants are first determined. According to various embodiments, four-phase motors are used. To create a four-phase linear motor, the magnet force constants, Km, located above each coil are determined. The force constant of a magnet 212 located above a coil in the center column 404 of a coil array, which coincides with commutation origin, is constructed as follows:

$$K_{xmag(0)} = K_a \sin(x+0) \quad \text{[Equation 1]}$$

Thus, $K_a$ is the peak-to-peak amplitude of the magnet force constant, $K_m$. Similarly, the force constants of magnets located above coils in columns 403 and 405, respectively, are as follows:

$$K_{xmag(3)} = K_a \sin\left(x + \frac{3\pi}{2}\right) \quad \text{[Equation 2]}$$

$$K_{xmag(-3)} = K_a \sin\left(x - \frac{3\pi}{2}\right) \quad \text{[Equation 3]}$$

It should be noted that the factors of 3 in Equations 2 and 3 above are due to the 3 pitch offset from the origin 218. According to various embodiments, the force constants of half magnets 214 located above coils in columns 406 and 402, respectively, are as follows:

$$K_{xmag(6)} = \frac{1}{2} K_a \sin\left(x + \frac{6\pi}{2}\right) \quad \text{[Equation 4]}$$

$$K_{xmag(-6)} = \frac{1}{2} K_a \sin\left(x - \frac{6\pi}{2}\right) \quad \text{[Equation 5]}$$

As indicated in Equations 4 and 5, the factors of 6 are due to the 6 pitch offset of the respective coils a distance of 6 pitch from the origin 218, while the factors of one half account for the half-size of magnets 214.

Next, to create a driving force in the x-direction and located at the center of each coil, assuming the current in each coil has the same phase as the respective magnet force constant, the following currents are required for coils 208 in columns 402, 403, 404, 405, and 406 are as follows.

$$Ix(-6) = I\sin\left(x - \frac{6\pi}{2}\right); \quad \text{[Equation 6]}$$

$$Ix(-3) = I\sin\left(x - \frac{3\pi}{2}\right); \quad \text{[Equation 7]}$$

$$Ix(0) = I\sin\left(x + \frac{0\pi}{2}\right); \quad \text{[Equation 8]}$$

$$Ix(3) = I\sin\left(x + \frac{3\pi}{2}\right); \quad \text{[Equation 9]}$$

$$Ix(6) = I\sin\left(x + \frac{6\pi}{2}\right); \quad \text{[Equation 10]}$$

Thus, a total driving force, F, is the summation of the products of the individual driving forces and their respective force constants.

The characteristics of the current, magnet constants, and forces for driving a magnet array are described in U.S. patent application Ser. No. 10/000,370 to Bausan Yuan and titled Moving Magnet Type Planar Motor Control, the entirety of which is incorporated by reference for all purposes. The techniques of the present invention recognize that the phase of the current introduced into the various coils depends on the position of the magnet array above a coil array.

Before current is introduced into the coils in the coil array, a magnet array may lie on a bed of air above the coil array. The magnet array may be oriented in any one of various positions above the coil array. When current is introduced into the coils in the coil array, the magnet array squares up into on of a limited number of positions. In typical embodiments, the magnet array is driven to an initial location such as to the center of the coil array. FIGS. 5A–5I are diagrammatic representations of nine possible positions the magnet array may reside above a coil array within 360 degrees along the x and y axes. The distance between centers of adjacent coils along the x and y axes is referred to herein as 360 degrees. According to various embodiments, a coil array may reside in nine possible positions within 360 degrees along the x and y axes upon initialization. Introducing current into coils in a coil array is referred to herein as initialization.

If current with an incorrect phase is provided to coils of a coil array, the magnet array may not move without torque along the x and y axes. A phase associated with a coil current that allows movement of a magnet array along an axis with substantially no yaw is referred to herein as the correct phase. In one example as shown in FIGS. 5A–5I, if current with the correct phase values are introduced into the coil arrays to drive the magnet array along the x-axis 251, the magnet array will move along the x-axis 251 without substantial torque in either the clockwise direction 501 or the counterclockwise direction 503. If current with other phase values are introduced into the coil arrays to drive the magnet array along the x-axis 251, the magnet array may experience yaw in either the clockwise direction 501 or the counterclockwise direction 503.

Figure 5B:
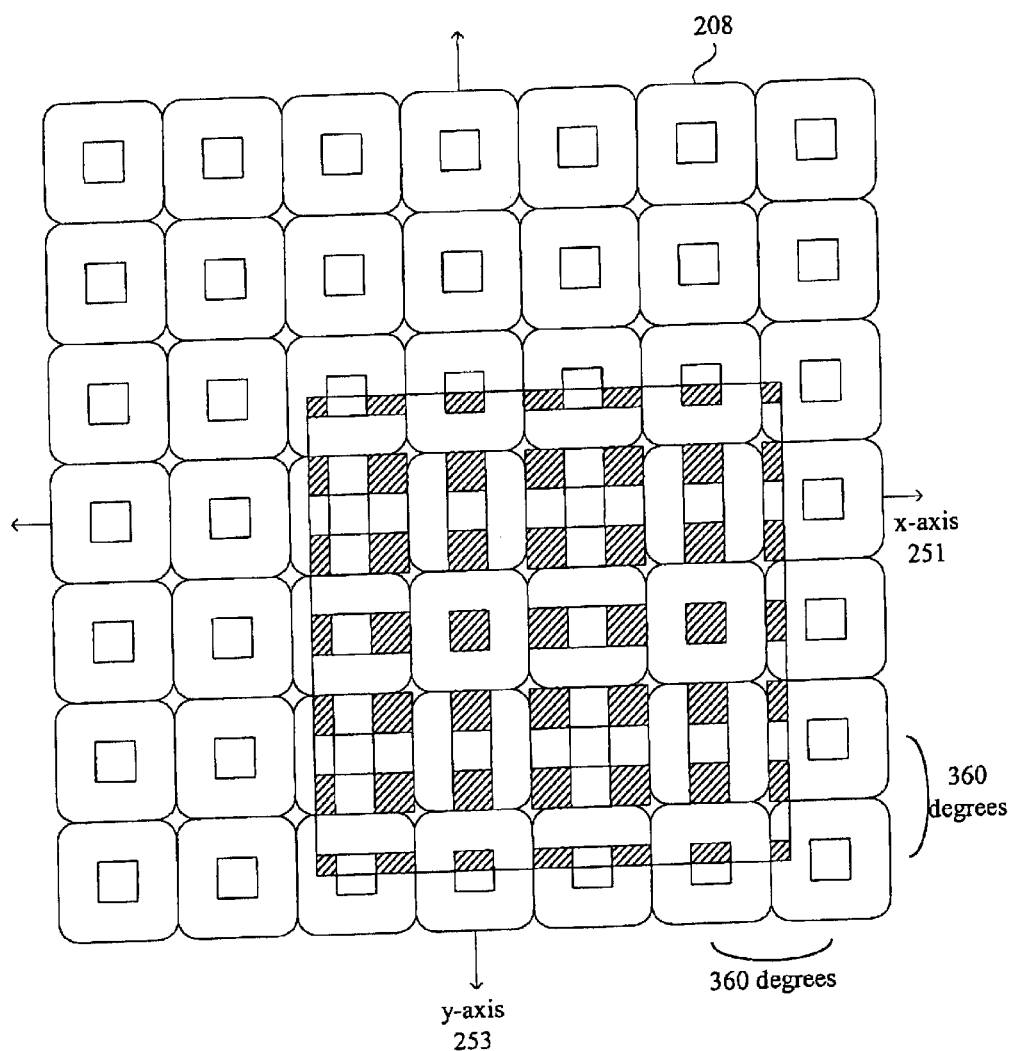
Figure 5C:
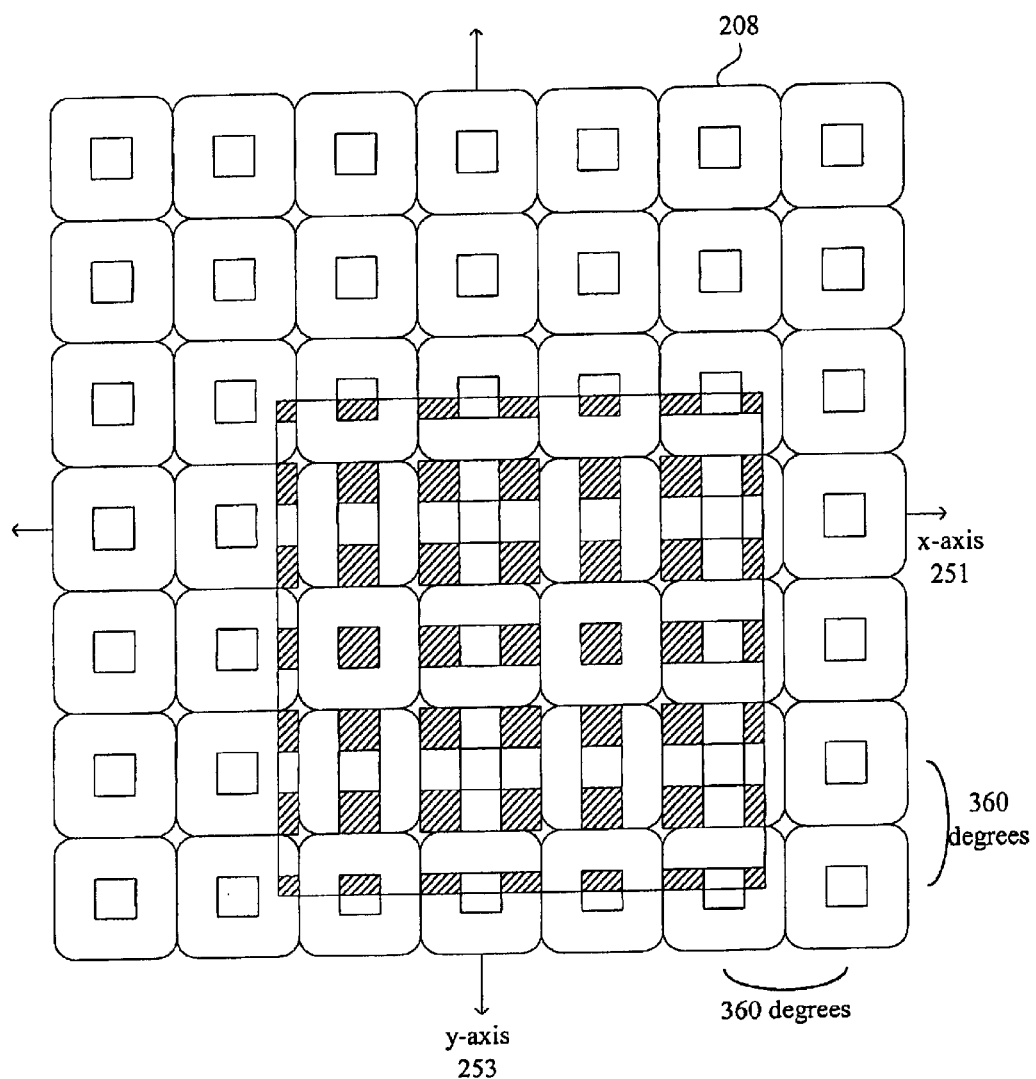
Figure 5D:
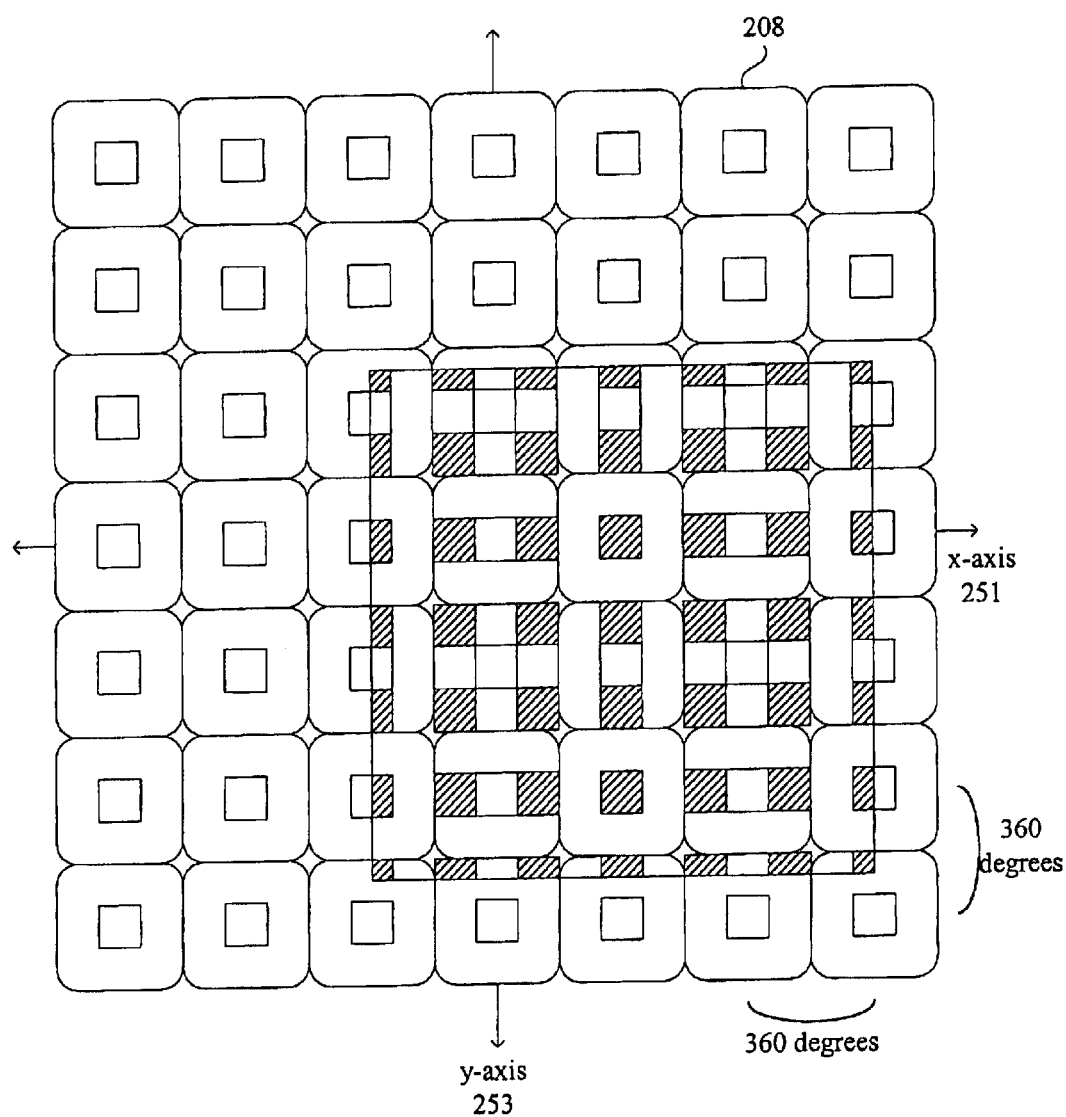
Figure 5E:
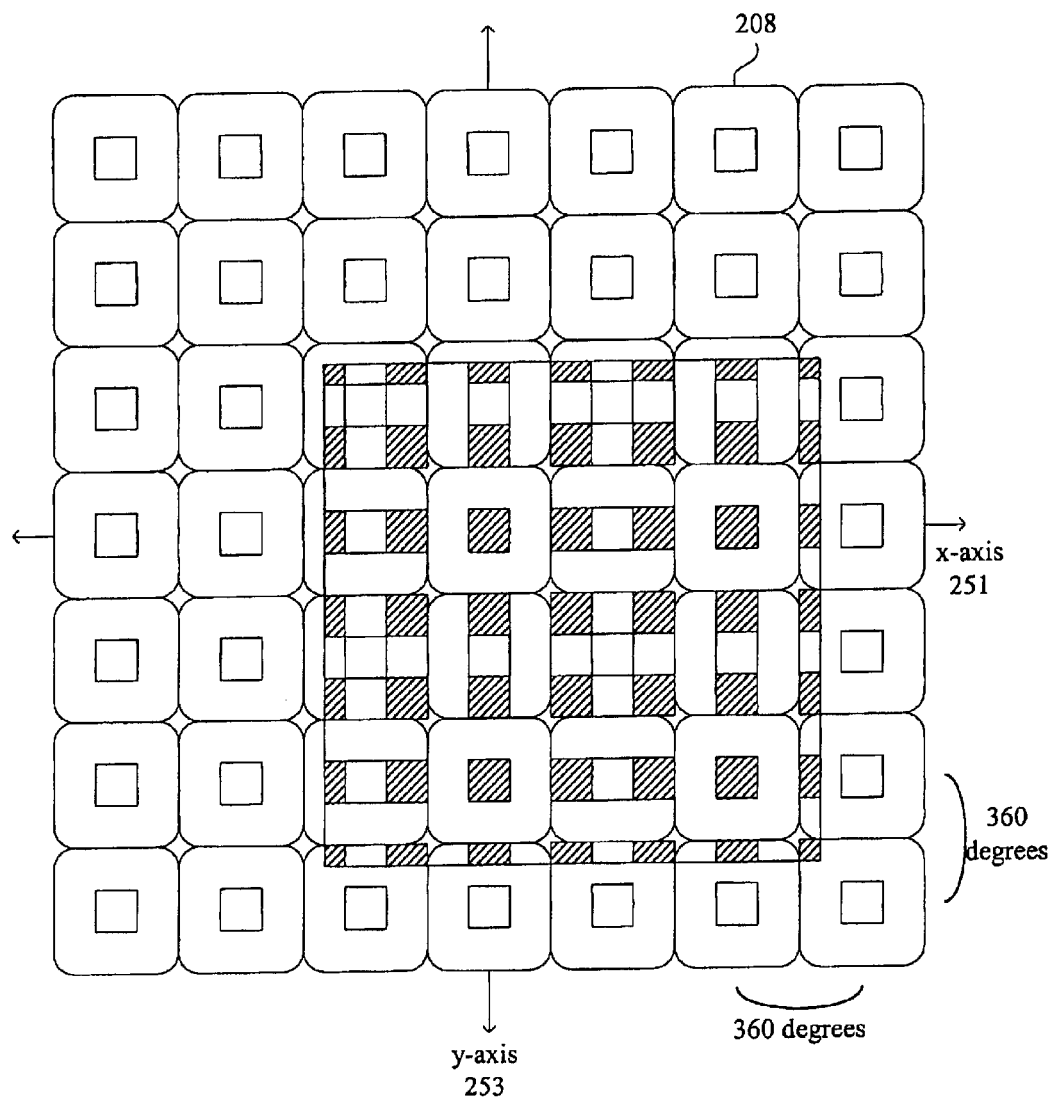
Figure 5F:
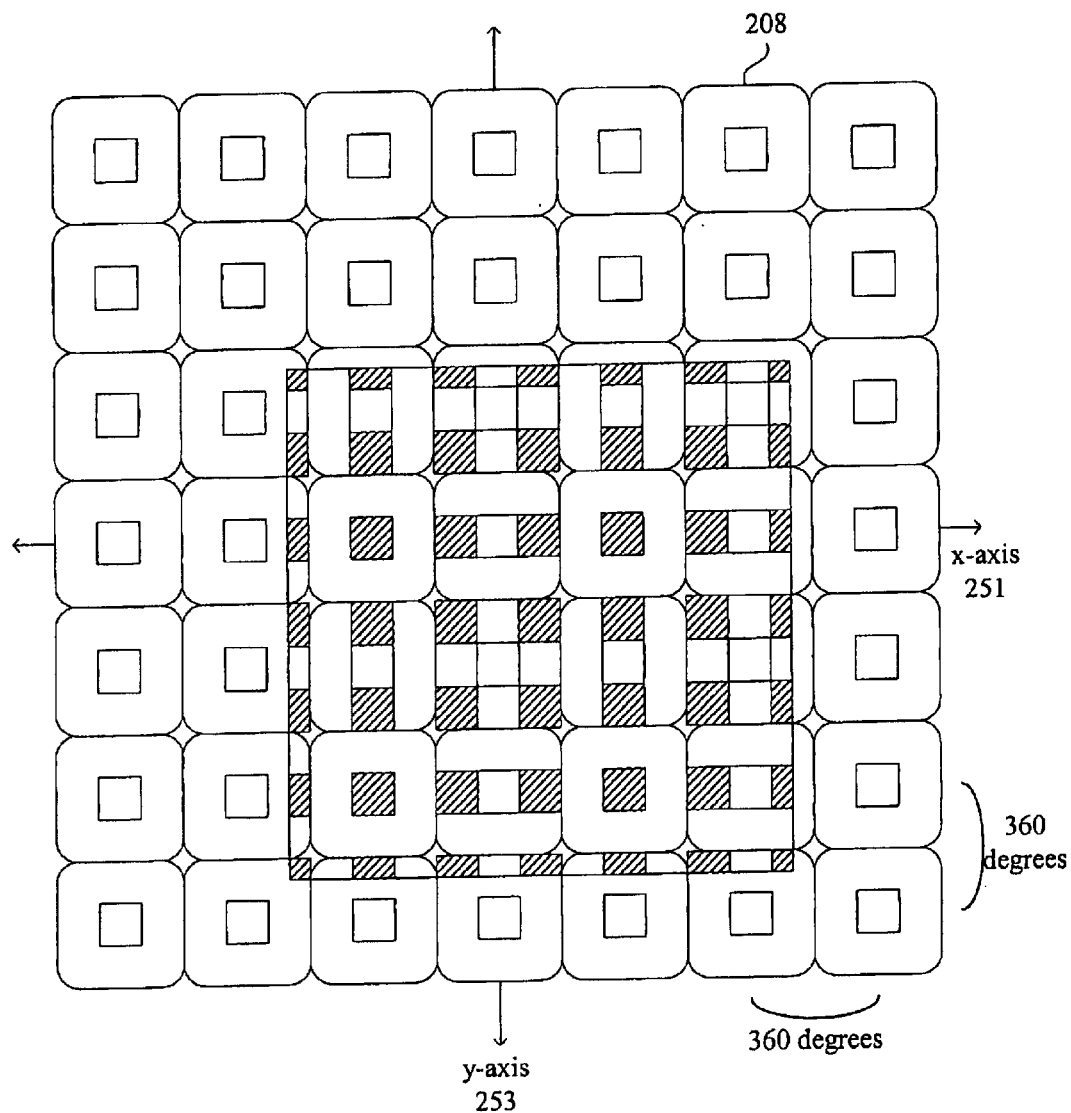
Figure 5G:
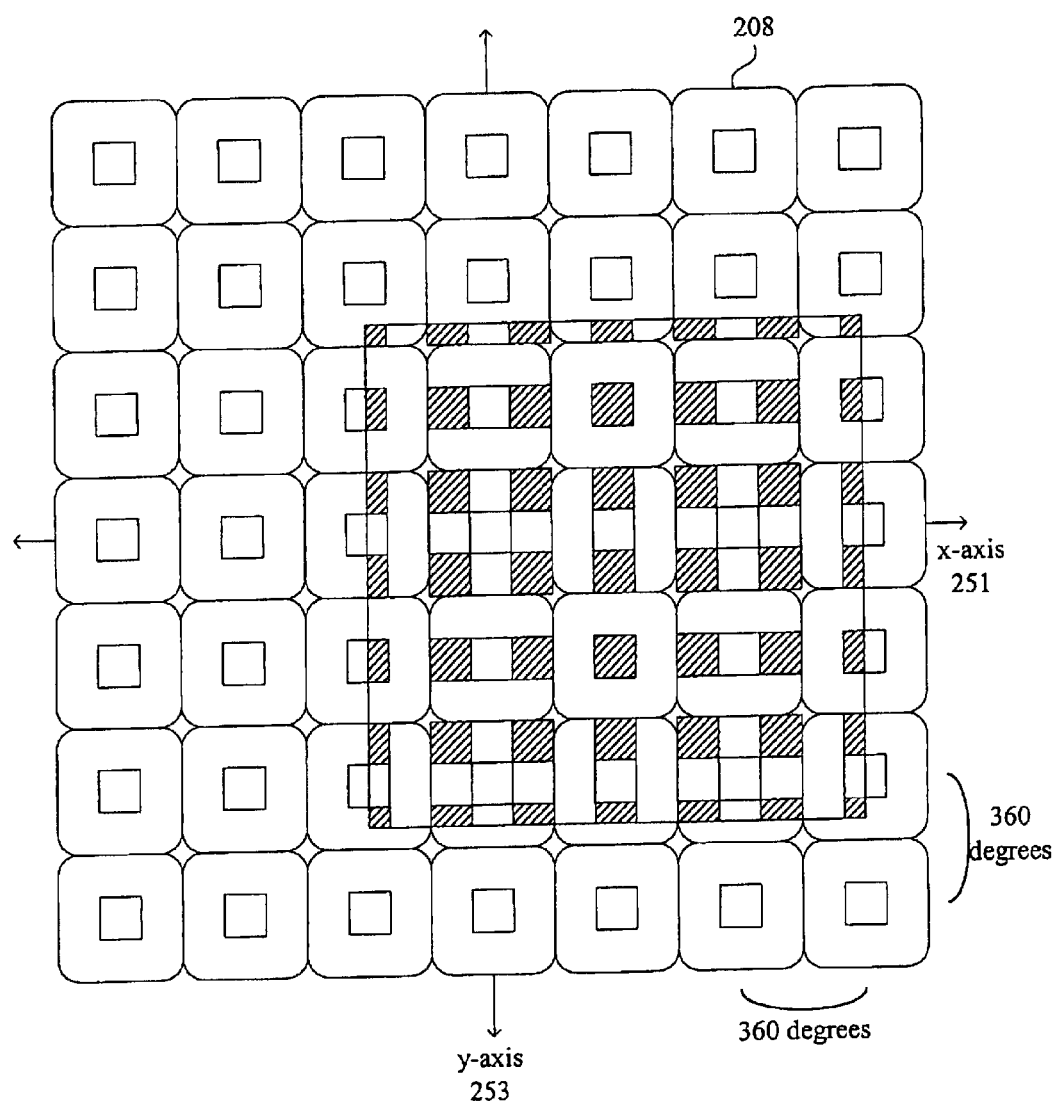
Figure 5H:
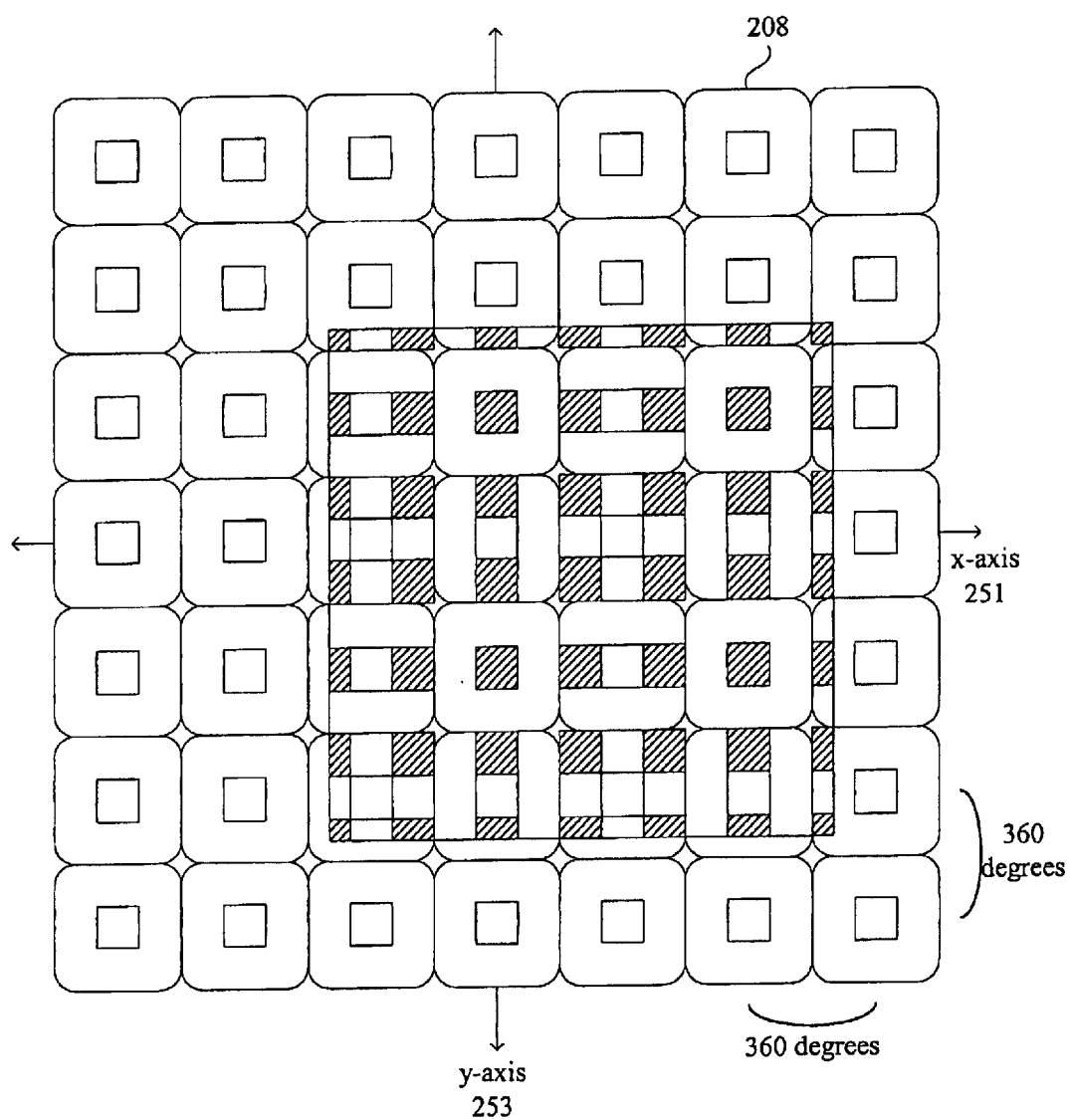
Figure 5I:
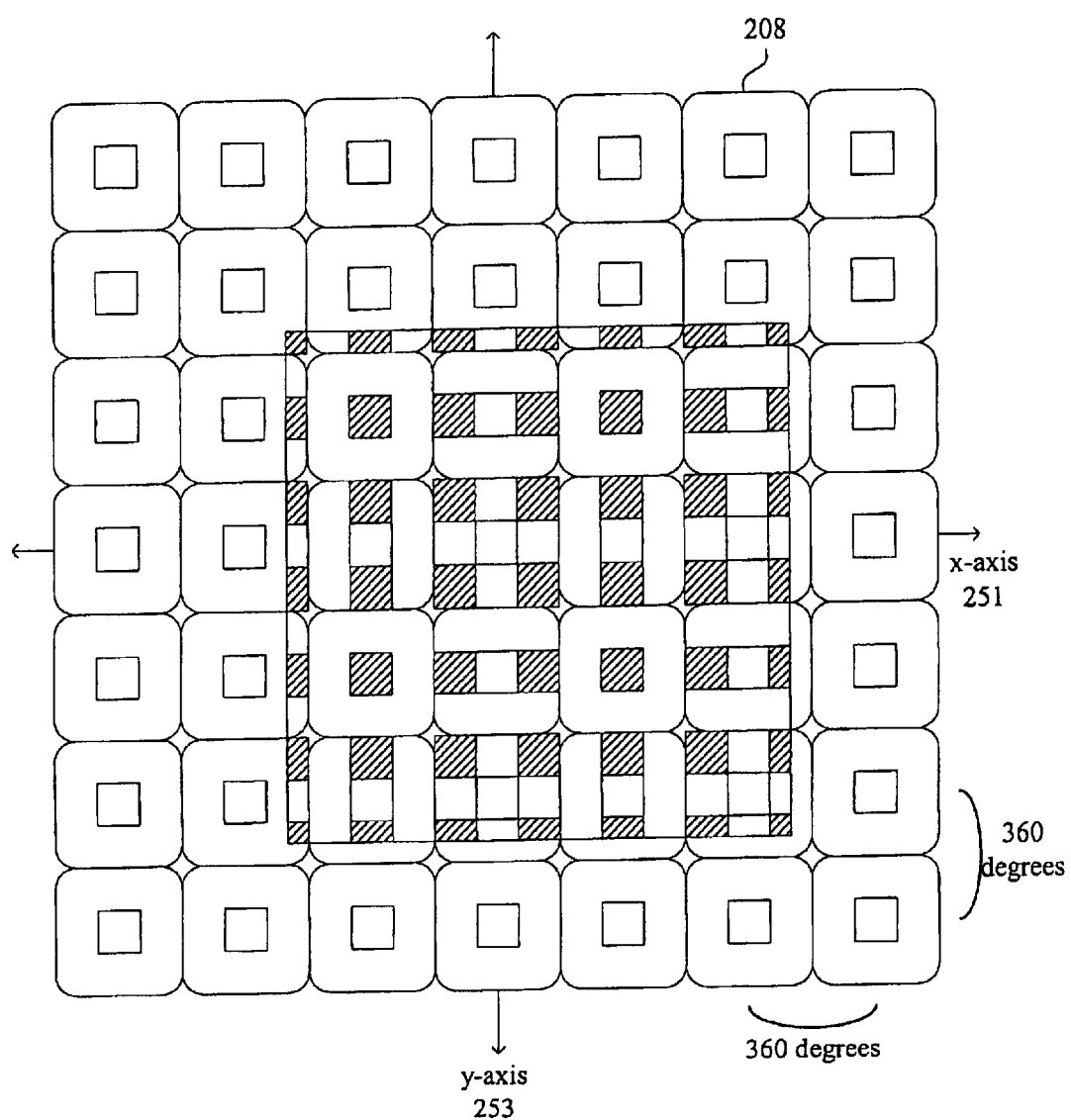
Figure 5J:
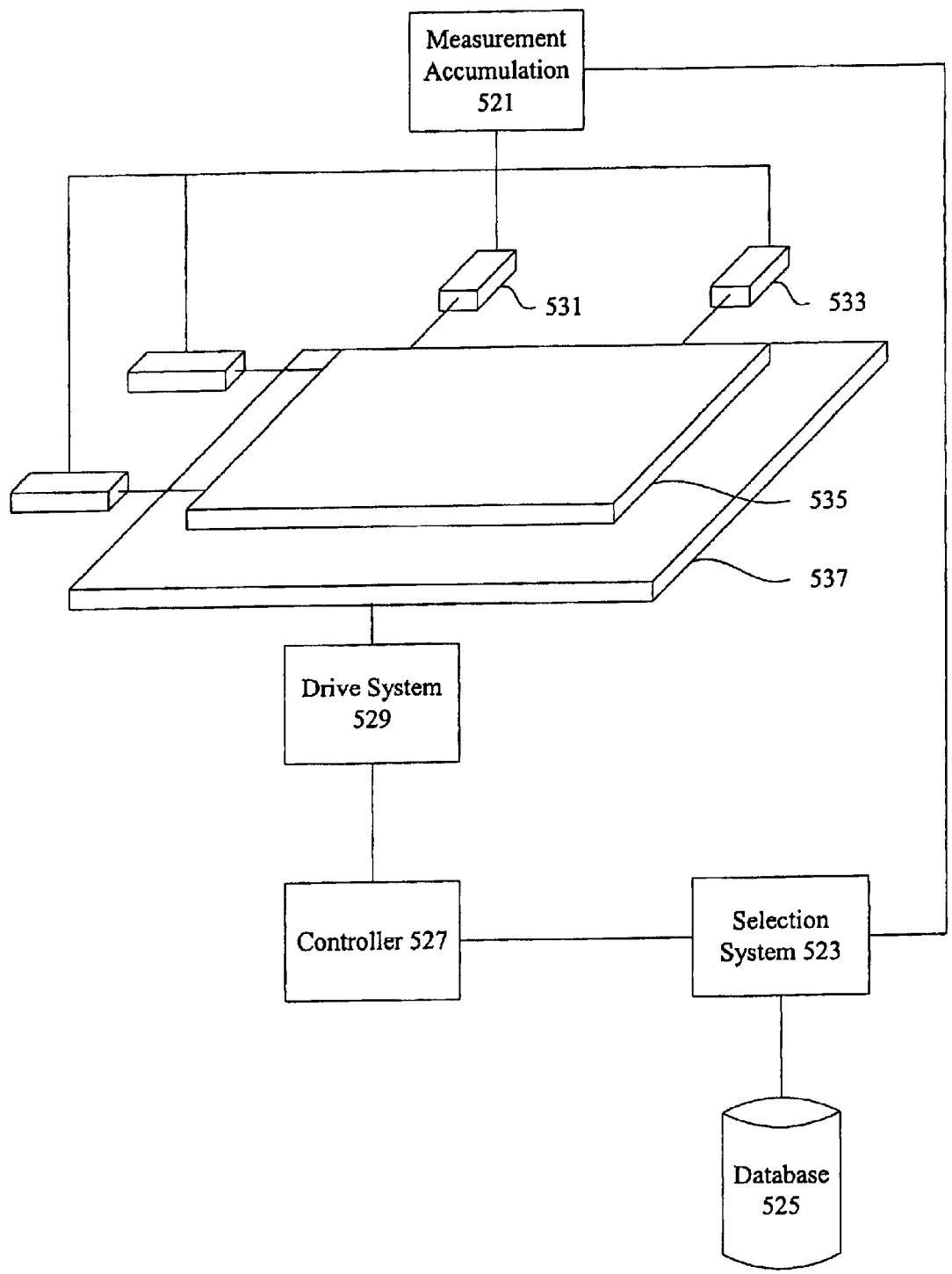
FIG. 5J is a diagrammatic representation of a magnet array apparatus.

FIG. 5J is a diagrammatic representation of a planar motor apparatus for determining the relative position of the magnet array and providing the current offsets to drive the magnet array with substantially no yaw. According to various embodiments, the planar motor includes sensors such as interferometers 531 and 533. The interferometers operate by projecting laser beams that reflect off the side surfaces of the magnet array 535 (or positioning stage 206) or mirror members fixed to positioning stage 206, for example. Interferometers can be used to measure torque characteristics of the magnet array as the magnet array is driven by the current in the coil arrays. Interferometers can also be used to determine the general position of the magnet array. According to various embodiments, the interferometers are operable to determine the general position of the magnet array 535 (positioning stage 206). In one example, the interferometers are able to determine that the magnet array is in one of nine different positions, e.g. the nine different positions shown in FIGS. 5A–5I. However, torque characteristics are needed to determine which one of the nine positions the magnet array is situated.

The measurement accumulation device 521 aggregates the information the interferometers provides and outputs the information to selection system 523. In one embodiment, the measurement accumulation device 521 determines torque characteristics when the magnet array 535 is driven in the x-direction and torque characteristics when the magnet array is driven in the y-direction. According to various embodiments, the measurement accumulation device 521 and the selection system 523 determine the relative position of the magnet array. In one example, the accumulation device 521 and the selection system 523 determine which one of nine different positions the magnet array is situated in by using a database 525. In one embodiment, the database includes the following table:

TABLE 1

Relative Position Determination

| Position | X-Direction Torque Characteristics | Y-Direction Torque Characteristics |
|---|---|---|
| 1 | Clockwise Rotation | Substantially No Yaw |
| 2 | Clockwise Rotation | Counterclockwise Rotation |
| 3 | Clockwise Rotation | Clockwise Rotation |
| 4 | Substantially No Yaw | Substantially No Yaw |
| 5 | Substantially No Yaw | Counterclockwise Rotation |
| 6 | Substantially No Yaw | Clockwise Rotation |
| 7 | Counterclockwise Rotation | Substantially No Yaw |
| 8 | Counterclockwise Rotation | Counterclockwise Rotation |
| 9 | Counterclockwise Rotation | Clockwise Rotation |

The selection system 523 provides the position to the controller 527. The controller 527 selects the current offset to provide to the drive system 529 based on the position. According to various embodiments, the position and the current offsets for a magnet array in a variety of positions are determined empirically and entered into the database 525. Examples of phase offsets that can be introduced into equations such as Equations 6 through 10 are 0, 90, 180, 270 degrees or equivalently $$\frac{0\pi}{2}, \frac{1\pi}{2}, \frac{2\pi}{2}, \frac{3\pi}{2},$$

etc. The drive system 529 provides current to the individual coils modified with the determined phase offsets in order to initialize the magnet array. In one example, the drive system provides current to a 7×7 coil array using equations 6–10 through amplifiers associated with each coil. One example of a specific drive system that can be used is described U.S. patent application Ser. No. 10/000,370 to Bausan Yuan and titled Moving Magnet Type Planar Motor Control, the entirety of which is incorporated by reference for all purposes.

It should be noted that the various systems such as the drive system 529, controller 527, selection system 523, and the measurement accumulation system 521 can be implemented as the separate components and devices or as a single computer system or parts of a computer system. In one embodiment, a single computer system performs measurement accumulation operations, determines positions using a database 525, uses the positions to determine current offsets, and determines the current to provide to each coil in the coil array. In other embodiments, different computer systems are specifically configured to accumulate measurements, determine positions and current offsets and provide the current to each coil in the coil array.

Figure 6:
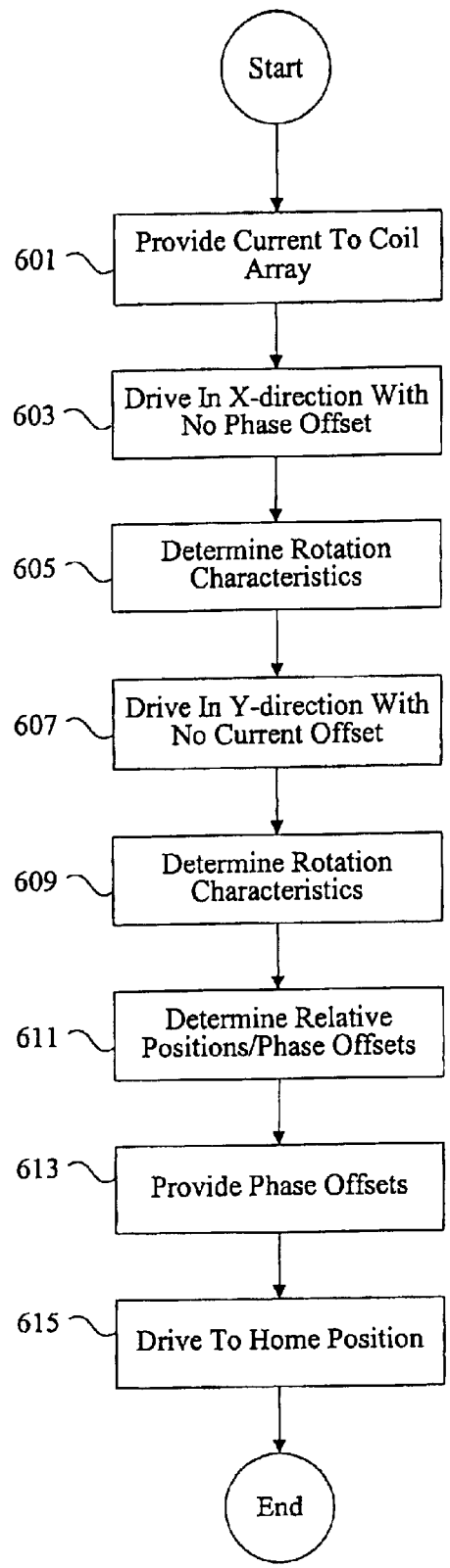
FIG. 6 is a process flow diagram showing the initialization of a planar magnet array.

FIG. 6 is a flow process diagram showing techniques for initializing the planar motor according to various embodiments. At 601, current is provided to coils in a coil array. The current provided causes a magnet array that typically is floating on a bed of air prior to the introduction of the current two square up into one of a plurality of positions. At 603, the magnet array is driven in the x-direction with no phase offset provided to individual coils of a coil array. Examples of phase offsets that can be introduced into equations such as Equations 6 through 10 are 0, 90, 180, 270 degrees or equivalently $$\frac{0\pi}{2}, \frac{1\pi}{2}, \frac{2\pi}{2}, \frac{3\pi}{2},$$

etc. It should be noted that amplitudes and phase values for current provided to individual coils in a coil array may be different. In one example, current phases for coils in different columns and rows may be different. According to various embodiments however, no offset is introduced for the amplitude and phase values already provided. In one example, the currents introduced thus can be similar to those shown in Equations 6 through 10. At 605, torque characteristics of the magnet array are determined. According to various embodiments, the magnet array may rotate clockwise, rotate counterclockwise, or move along the axis with substantially no yaw.

The torque characteristics of the magnet array can be determined using mechanisms such as interferometers. At 607, the magnet array is driven in the y-direction with no phase offset provided to the individual coils of a coil array. At 609, torque characteristics of the magnet array are determined. According to various embodiments, the magnet array may rotate clockwise, rotate counterclockwise, or move along the wine access with substantially no yaw. The techniques of the present invention recognized that the torque characteristics provide information on the correct phase offset is for the current in the coil arrays. In one embodiment, the torque characteristics allow the determination of the relative position of the magnet array. Based on the relative position of the magnet array, the correct phase offsets for driving the magnet array of the x-direction and driving the magnet array in the y-direction can be provided. Relative positions are shown in FIGS. 5A through 5I.

According to various embodiments, the torque characteristics obtained can be used to reference entry in the cable containing information about relative position and correct phase offsets. According to other embodiments, torque characteristics can be used to reference stored in the database. The combination the theater from 1 or that torque characteristic information can be used to determine the position of the magnet array. Upon all the position of the magnet array, phase offsets can be introduced into the coils of coil array to drive the magnet array to an initial position. The techniques of the present invention provide benefits over typical techniques for initializing the magnet array. And typical implementations, robotics and sensitive detection sensors would be used to determine the position no magnet array and move the magnet array to an initial position. Instead of the interferometer, an encoder system may be used as the detector to detect the torque characteristics. In this case, the encoder system can detect the relative position between the coil array and the magnet array in two (X and Y) directions. Further, an X-Y position sensor that is a part of the optical sensor stage disclosed in U.S. Pat. No. 4,345,836, may be utilized to detect the torque characteristics of the magnet array. The disclosures in U.S. Pat. No. 4,345,836 is incorporated herein by reference for all purposes. According to various embodiments, the techniques of the present invention to allow for automatic initialization of a magnet array without the use of robotics or highly sensitive measurement equipment.

Figure 7:
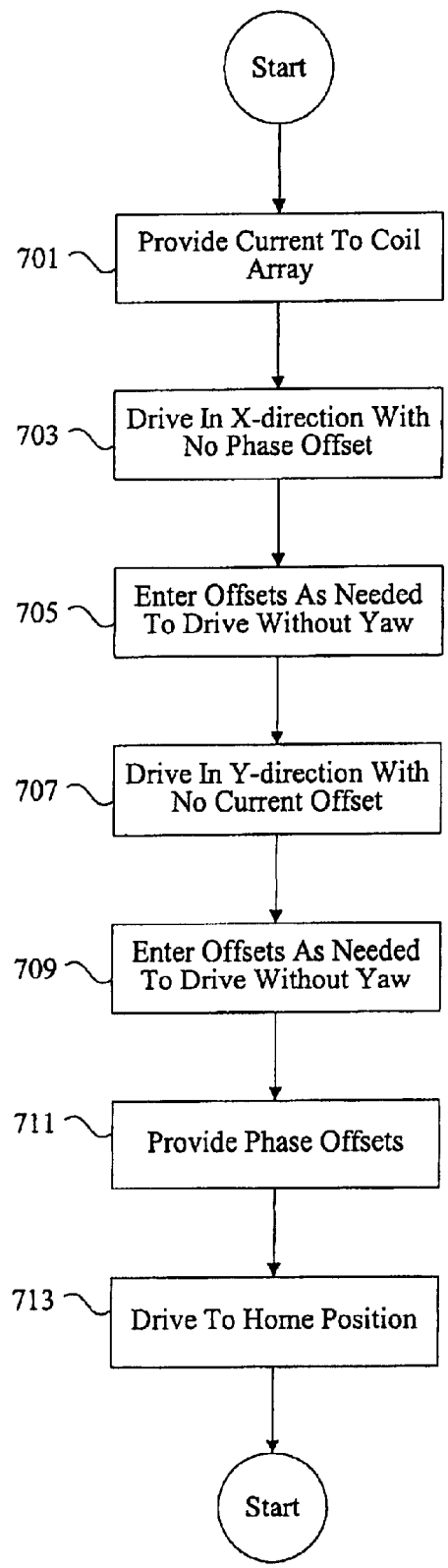
FIG. 7 is a process flow diagram showing another embodiment of initialization of a planar magnet array.

FIG. 7 is a flow process diagram showing techniques for initializing the planar motor according to other embodiments. At 701, current is provided to coils of the coil array.

At 703, the magnet array is driven in the x-direction with no phase offsets introduced into the coils in the coil array. Mechanisms and devices such as interferometers can be used to act whether or are not yaw is present. If no yaw is present, a phase offset is not needed. If yacht is present, different phase offsets can be entered into the coils in the coil array and tested to determine whether or not the magnet array can be driven without yaw. One offset is found that allows the coils in the coil array to drive the magnet array without yaw, the onset is saved. At 707, the magnet array is driven in the y-direction with no current offset. A phase introduced into current in coils for driving a magnet array is referred to herein as a phase offset or a current offset. In one example, phase offsets are introduced into Equations 6 through Equation 10. At 709, offsets are introduced as needed to drive the main array without yaw in the y-direction. At 711, phase assets are provided to drive the magnet array to a home position at 713.

Figure 8:
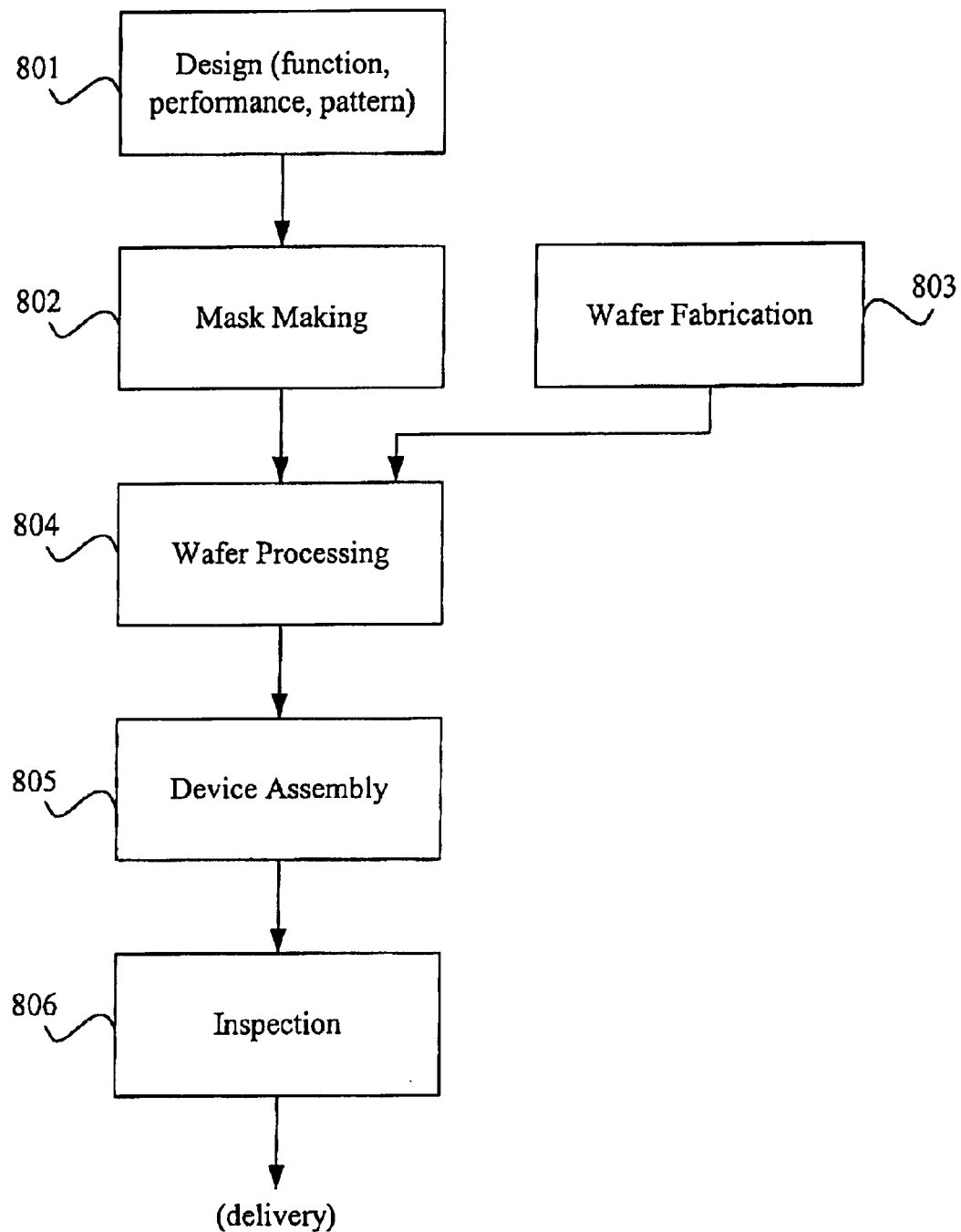
FIG. 8 is a process flow diagram showing semiconductor fabrication.

Further, semiconductor devices can be fabricated using the above described systems, by the process shown generally in FIG. 8. In step 801 the device's function and performance characteristics are designed. Next, in step 802, a mask (reticle) having a pattern it designed according to the previous designing step, and in a parallel step 803, a wafer is made from a silicon material. The mask pattern designed in step 802 is exposed onto the wafer from step 803 in step 804 by a photolithography system such as the systems described above. In step 805 the semiconductor device is assembled (including the dicing process, bonding process and packaging process), then finally the device is inspected in step 306.

Figure 9:
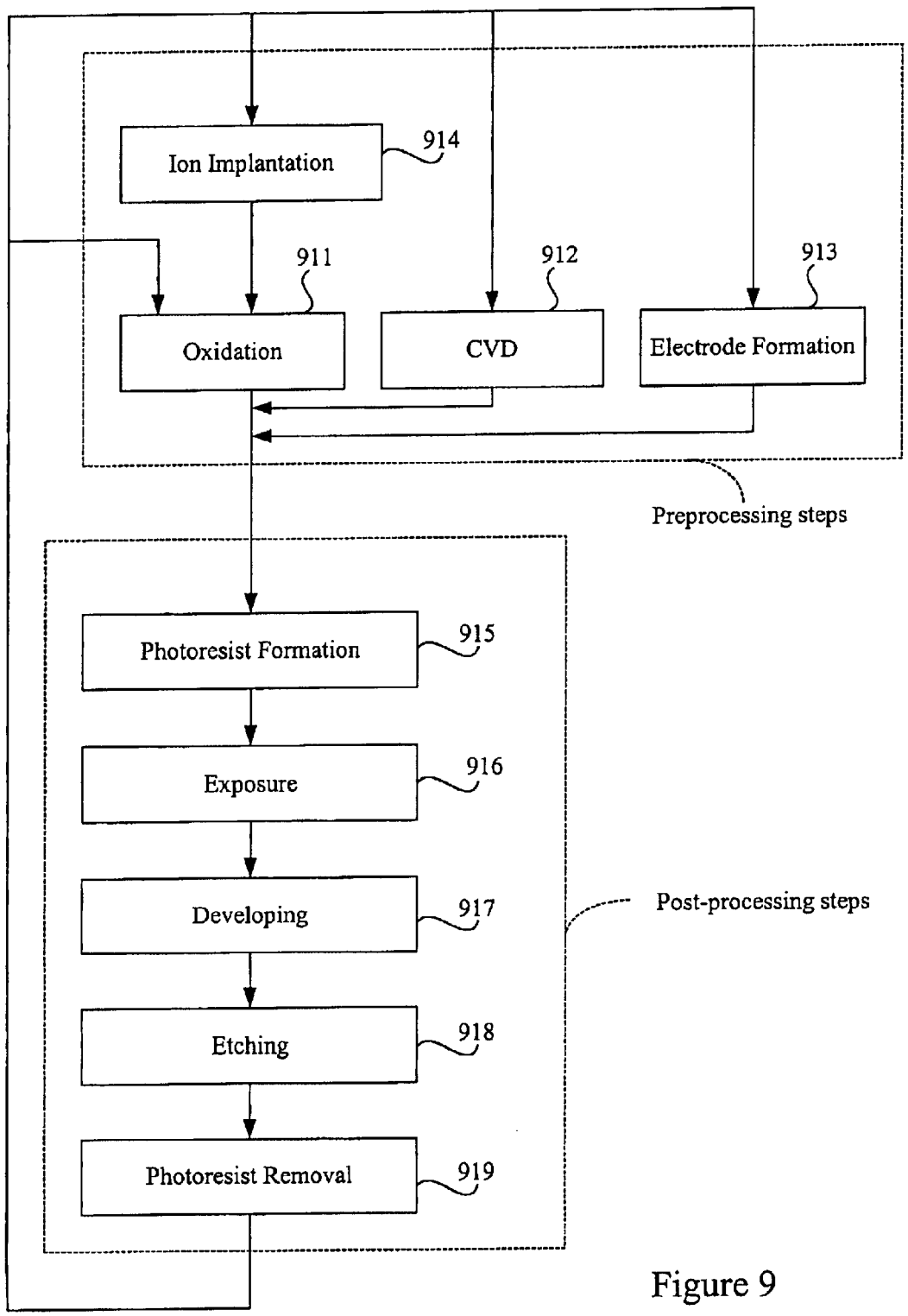
FIG. 9 is a process flow diagram showing wafer processing.

FIG. 9 illustrates a detailed flowchart example of the above-mentioned step 804 in the case of fabricating semiconductor devices. In step 911 (oxidation step), the wafer surface is oxidized. In step 912 (CVD step), an insulation film is formed on the wafer surface. In step 913 (electrode formation step), electrodes are formed on the wafer by vapor deposition. In step 914 (ion implantation step), ions are implanted in the wafer. The above mentioned steps 911–914 form the preprocessing steps for wafers during wafer processing, and selection is made at each step according to processing requirements.

At each stage of wafer processing, when the above-mentioned preprocessing steps have been completed, the following post-processing steps are implemented. During post-processing, initially, in step 915 (photoresist formation step), photoresist is applied to a wafer. Next, in step 916, (exposure step), the above-mentioned exposure device is used to transfer the circuit pattern of a mask (reticle) to a wafer. Then, in step 917 (developing step), the exposed wafer is developed, and in step 918 (etching step), parts other than residual photoresist (exposed material surface) are removed by etching. In step 919 (photoresist removal step), unnecessary photoresist remaining after etching is removed. Multiple circuit patterns are formed by repetition of these preprocessing and post-processing steps.

While the invention has been particularly shown and described with reference to specific embodiments thereof, it will be understood by those skilled in the art that changes in the form and details of the disclosed embodiments may be made without departing from the spirit or scope of the invention. It is therefore intended that the invention be interpreted to include all variations and equivalents that fall within the true spirit and scope of the present invention.

What is claimed is:

1. A method for initializing a planar motor, the method comprising:

providing current to a coil array to drive a planar magnet array in a first direction;

determining first torque characteristics associated with driving the planar magnet array in the first direction;

providing a first current offset using the first torque characteristics for driving the planar magnet array in the first direction with substantially no yaw, wherein the first current offset determined is 0, 90, 180, or 270 degrees.

2. The method of claim 1, further comprising:

providing current to a coil array to drive the planar magnet array in a second direction substantially orthogonal to the first direction;

determining second torque characteristics associated with driving the planar magnet array in the second direction;

providing a second current offset using the second torque characteristics for driving the planar magnet array in the second direction with substantially no yaw.

3. The method of claim 2, wherein the second offset determined is 0, 90, 180, or 270 degrees.

4. The method of claim 3, wherein the first and second torque characteristics are determined using interferometers.

5. The method of claim 2, wherein providing first and second current offsets comprises determining the relative position of the planar magnet array with respect to the coil array.

6. The method of claim 5, wherein determining the relative position of the planar magnet array with respect to the coil array comprises referencing a database entry using the first and second torque characteristics.

7. The method of claim 5, wherein determining the relative position of the planar magnet array comprises selecting one possible relative position out of a plurality of possible relative positions.

8. The method of claim 5, wherein the coil array comprises a plurality of coils, each coil fixed in position with respect to the other coils.

9. The method of claim 8, wherein the coil array is square and comprises at least 25 coils.

10. The method of claim 8, wherein the planar magnet array comprises a plurality of magnets, each magnet fixed in position with respect to the other magnets.

11. The method of claim 10, further comprising driving the planar magnet stage to an initial position.

12. The method of claim 11, wherein the planar magnet stage is suspended by flux generated by the coil array.

13. A method for initializing a stage device including a planar motor that positions the stage using a position detector, the method comprising:

providing current to a coil array to drive a magnet array of the planar motor in a first direction;

detecting first torque characteristics associated with driving the magnet array in the first direction by using a position detector;

providing a first current offset using the first torque characteristics for driving the magnet array in the first direction with substantially no yaw, wherein the first current offset determined is 0, 90, 180, or 270 degrees.

14. The method of claim 13, further comprising:

providing current to a coil array to drive the planar magnet array in a second direction substantially orthogonal to the first direction;

determining second torque characteristics associated with driving the planar magnet array in the second direction;

providing a second current offset using the second torque characteristics for driving the planar magnet array in the second direction with substantially no yaw.

15. A method for initializing a photolithography system including an illumination system that irradiates radian energy and a planar motor that positions a movable stage relative to the path of said radiant energy using a position detector, the method comprising:

providing current to a coil array to drive a magnet array of the planar motor in a first direction;

detecting first torque characteristics associated with driving the magnet array in the first direction utilizing by using a position detector;

providing a first current offset using the first torque characteristics for driving the magnet array in the first direction with substantially no yaw, wherein the first current offset determined is 0, 90, 180, or 270 degrees.

16. The method of claim 15, further comprising:

providing current to a coil array to drive the planar magnet array in a second direction substantially orthogonal to the first direction;

determining second torque characteristics associated with driving the planar magnet array in the first direction;

providing a second current offset using the second torque characteristics for driving the planar magnet array in the second direction with substantially no yaw.

17. A method for making an object, the method including a photolithography process using the method of initializing a photolithography system of claim 15.

18. A photolithography system, comprising:

a drive system operable to provide current to a coil array to drive a planar magnet array in a first direction; and a detector system operable to determine first torque characteristics associated with driving the planar magnet array in the first direction;

wherein the drive system is further operable to provide a first current offset using the first torque characteristics for driving the planar magnet array in the first direction with substantially no yaw, wherein the first current offset determined is 0, 90, 180, or 270 degrees.

19. The photolithography system of claim 18, wherein the drive system is operable to provide current to a coil array to drive the planar magnet array in a second direction substantially orthogonal to the first direction.

20. The photolithography system of claim 19, wherein the detector system is configured determining second torque characteristics associated with driving the planar magnet array in the second direction.

21. The photolithography system of claim 20, wherein the drive system is operable to provide a second current offset using the second torque characteristics for driving the planar magnet array in the second direction with substantially no yaw.

22. A photolithography system, comprising:

means for providing current to a coil array to drive a planar magnet array in a first direction;

means for determining first torque characteristics associated with driving the planar magnet array in the first direction; and means for providing a first current offset using the first torque characteristics for driving the planar magnet array in the first direction with substantially no yaw, wherein the first current offset determined is 0, 90, 180, or 270 degrees.

23. The photolithography system of claim 22, further comprising:

means for providing current to a coil array to drive the planar magnet array in a second direction substantially orthogonal to the first direction;

means for determining second torque characteristics associated with driving the planar magnet array in the second direction;

means for providing a second current offset using the second torque characteristics for driving the planar magnet array in the second direction with substantially no yaw.

* * * * *